US008334701B2

(12) United States Patent
Knippelmeyer et al.

(10) Patent No.: US 8,334,701 B2
(45) Date of Patent: Dec. 18, 2012

(54) REPAIRING DEFECTS

(75) Inventors: Rainer Knippelmeyer, Winchester, MA (US); Christoph Riedesel, Aalen (DE); John Morgan, Marblehead, MA (US); Lawrence Scipioni, Bedford, MA (US)

(73) Assignee: Carl Zeiss NTS, LLC, Dover, DE (US)

( * ) Notice: Subject to any disclaimer, the term of this patent is extended or adjusted under 35 U.S.C. 154(b) by 603 days.

(21) Appl. No.: 12/549,759

(22) Filed: Aug. 28, 2009

(65) Prior Publication Data

US 2010/0052697 A1 Mar. 4, 2010

Related U.S. Application Data

(60) Provisional application No. 61/092,919, filed on Aug. 29, 2008.

(51) Int. Cl.
*G01R 31/02* (2006.01)
(52) U.S. Cl. .................................................. 324/537
(58) Field of Classification Search ................ None
See application file for complete search history.

(56) References Cited

U.S. PATENT DOCUMENTS

| | | | | |
|---|---|---|---|---|
| 5,429,730 | A * | 7/1995 | Nakamura et al. | 204/192.34 |
| 7,115,865 | B2 * | 10/2006 | Chang et al. | 250/307 |
| 7,429,867 | B1 * | 9/2008 | de Jong | 324/750.3 |
| 7,560,920 | B1 * | 7/2009 | Ouyang et al. | 324/242 |
| 7,656,170 | B2 * | 2/2010 | Pinto et al. | 324/754.22 |
| 7,772,867 | B2 * | 8/2010 | Guldi et al. | 324/762.05 |
| 2004/0101981 | A1 * | 5/2004 | Morishita | 438/5 |
| 2006/0138323 | A1 * | 6/2006 | Chang et al. | 250/307 |
| 2006/0284091 | A1 | 12/2006 | Ward | |
| 2006/0284092 | A1 | 12/2006 | Ward | |
| 2007/0051900 | A1 | 3/2007 | Ward | |
| 2007/0058148 | A1 * | 3/2007 | Nakano | 355/53 |
| 2007/0158558 | A1 | 7/2007 | Ward et al. | |
| 2007/0215802 | A1 | 9/2007 | Ward et al. | |
| 2007/0228287 | A1 | 10/2007 | Ward et al. | |
| 2009/0212793 | A1 * | 8/2009 | Guldi et al. | 324/751 |
| 2010/0003424 | A1 * | 1/2010 | Kim | 427/595 |
| 2010/0100356 | A1 * | 4/2010 | Tsutsui | 324/512 |
| 2011/0156717 | A1 * | 6/2011 | Tsai et al. | 324/538 |
| 2011/0156718 | A1 * | 6/2011 | Tsai et al. | 324/538 |

OTHER PUBLICATIONS

Livengood et al., "Helium ion microscope invasiveness and imaging study for semiconductor applications," J. Vac. Sci. Technolog., 25(6):2547-2552, (2007).

\* cited by examiner

*Primary Examiner* — Jermele M Hollington
(74) *Attorney, Agent, or Firm* — Fish & Richardson P.C.

(57) ABSTRACT

Methods and systems for defect repair are disclosed. The methods include: (a) identifying a defect causing an absence of an electrical connection between a first circuit element and a second circuit element, the first and second circuit elements being positioned in or on a substrate and the defect being positioned in the substrate; (b) removing a portion of the substrate to expose the defect, and depositing a conductive material to electrically connect the first and second circuit elements; and (c) verifying that the defect caused the absence of an electrical connection between the first and second circuit elements.

24 Claims, 6 Drawing Sheets

REPAIRING DEFECTS

CROSS-REFERENCE TO RELATED APPLICATIONS

This application claims priority under 35 U.S.C. §119(e) (1) to U.S. Ser. No. 61/092,919, filed Aug. 29, 2008, which is hereby incorporated by reference in its entirety.

TECHNICAL FIELD

This disclosure relates to charged particle sources, systems, and methods.

BACKGROUND

Defects in electrical connections between circuit elements can lead to a reduction in electrical conductivity between the circuit elements. Defects can also lead to the formation of undesired conductive pathways between electrical circuit elements. To restore proper functioning to circuit elements, it may be necessary to repair such defects.

SUMMARY

In general, in a first aspect, the disclosure features a method that includes: (a) identifying a defect causing an absence of an electrical connection between a first circuit element and a second circuit element, the first and second circuit elements being positioned in or on a substrate and the defect being positioned in the substrate; (b) removing a portion of the substrate to expose the defect, and depositing a conductive material to electrically connect the first and second circuit elements; and (c) verifying that the defect caused the absence of an electrical connection between the first and second circuit elements.

In another aspect, the disclosure features a method that includes: (a) identifying a defect corresponding to an electrical connection between a first circuit element and a second circuit element, the first and second circuit elements being positioned in or on a substrate and the defect being positioned in the substrate; (b) removing a portion of the substrate to expose the defect, and removing the defect to disconnect the first and second circuit elements; and (c) verifying that the first and second circuit elements are electrically disconnected.

In a further aspect, the disclosure features a method that includes: (a) identifying a suspected electrical defect positioned between a first circuit element and a second circuit element, the first and second circuit elements being positioned in or on a substrate and the suspected defect being positioned in the substrate; (b) removing a portion of the substrate to expose the suspected defect, and exposing the suspected defect to a charged particle beam to modify at least a portion of the suspected defect; and (c) verifying that the suspected defect corresponds to a real defect.

In another aspect, the disclosure features a method that includes identifying an electrical defect positioned between first and second circuit elements in a substrate, removing a portion of the substrate to expose the electrical defect, exposing the electrical defect to a charged particle beam to modify at least a portion of the electrical defect, and monitoring the first and second circuit elements during the exposure of the electrical defect to verify that the defect is repaired by the exposure.

In a further aspect, the disclosure features a method that includes: (a) identifying an electrical defect that includes a variation in an electrical path between first and second circuit elements in a substrate; (b) removing a portion of the substrate to expose the variation in the electrical path without removing any portion of the electrical path; and (c) forming an image of the variation in the electrical path.

In another aspect, the disclosure features a method that includes: (a) identifying a defect between a first circuit element and a second circuit element, the first and second circuit elements and the defect being positioned entirely within a body of a substrate; (b) removing a portion of the substrate body to expose the defect, and exposing the defect to a charged particle beam to modify at least a portion of the defect; and (c) verifying that the defect is repaired by the exposure.

Embodiments can include one or more of the following features.

The method can include identifying the defect by obtaining an image of the first and second circuit elements that includes voltage contrast information.

Identifying the defect can include exposing the first and second circuit elements to a charged particle beam to cause particles to leave the substrate, and forming an image of the first and second circuit elements based on the particles that leave the substrate. Identifying the defect can include identifying a difference in intensity between the first and second circuit elements in the image.

The charged particle beam can be an ion beam. The charged particle beam can include noble gas ions (e.g., helium ions). The particles that leave the substrate can include secondary electrons.

The first and second circuit elements can include lines of conductive material, and the defect can be positioned along a conductive path between the first and second circuit elements.

The first and second circuit elements can be positioned in a common plane of the substrate. The first and second circuit elements can be positioned in different planes of the substrate.

Removing the portion of the substrate can include exposing the substrate to the charged particle beam to remove the portion of the substrate. Removing the portion of the substrate can include exposing the substrate to a second charged particle beam, different from the charged particle beam used to form the image, to remove the portion of the substrate. The second charged particle beam can include gallium ions. The second charged particle beam can include noble gas ions.

Removing a portion of the substrate to expose the defect can include exposing a region of the substrate that includes the defect to a charged particle beam to cause particles to leave the exposed region, and forming an image of the exposed region based on the particles that leave the region. The charged particle beam can include ions (e.g., helium ions). The particles that leave the region can include secondary electrons.

Removing a portion of the substrate to expose the defect can include identifying a portion of the exposed region having an average intensity that differs from an average intensity of other portions of the exposed region in the image. Removing a portion of the substrate to expose the defect can include identifying adjacent portions of the exposed region where an intensity of a first one of the portions has a first average value, and an intensity of the other portion has a second average value different from the first average value.

Depositing the conductive material can include directing a charged particle beam to be incident on the substrate, and directing gas molecules to be incident on the substrate in the same region as the charged particle beam. The charged particle beam can be an ion beam. The charged particle beam can include helium ions. The charged particle beam can be an electron beam.

The gas molecules can include the conductive material. The conductive material can be at least one material selected from the group consisting of copper, tungsten, platinum, gold, and carbon.

Depositing the conductive material can include directing a charged particle beam to interact with a stream of gas molecules to deposit the conductive material to connect the first and second circuit elements.

Verifying that the defect caused the absence of an electrical connection between the first and second circuit elements can include, after depositing the conductive material, exposing at least one of the first and second circuit elements to a charged particle beam to cause particles to leave the substrate, and forming an image of the first and second circuit elements based on the particles that leave the substrate. Verifying that the defect caused the absence of an electrical connection between the first and second circuit elements can include determining that an average intensity of the first circuit element in the image corresponds to an average intensity of the second circuit element in the image.

Verifying that the defect caused the absence of an electrical connection between the first and second circuit elements can include, during deposition of the conductive material, exposing at least one of the first and second circuit elements to a charged particle beam to cause particles to leave the substrate, and forming one or more images of the first and second circuit elements based on the particles that leave the substrate. Verifying that the defect caused the absence of an electrical connection between the first and second circuit elements can include comparing an average intensity of the first circuit element in the one or more images to an average intensity of the second circuit element in the one or more images as the conductive material is deposited.

Verifying that the defect caused the absence of an electrical connection between the first and second circuit elements can include monitoring a change in average intensity of at least one of the first and second circuit elements in the one or more images as the conductive material is deposited.

The portion of the substrate can be removed without removing any portion of an electrical path comprising the defect. Removing the portion of the substrate can include forming a recess in the substrate so that at least a portion of the electrical path is positioned within the recess.

The defect can include an opening in an electrical path between the first and second circuit elements. The defect can include a variation in at least one dimension of an electrical path between the first and second circuit elements.

The method can include providing information about the defect to a semiconductor fabrication system.

Identifying the defect can include comparing an average intensity of the first circuit element and an average intensity of the second circuit element in the image.

Removing the defect can include exposing the defect to the charged particle beam that is used to form the image of the first and second circuit elements. Removing the defect can include exposing the defect to the second charged particle beam.

Verifying that the first and second circuit elements are electrically disconnected can include, after removing the defect, exposing at least one of the first and second circuit elements to a charged particle beam to cause particles to leave the substrate, and forming an image of the first and second circuit elements based on the particles that leave the substrate. Verifying that the first and second circuit elements are electrically disconnected can include comparing an average intensity of the first circuit element in the image to an average intensity of the second circuit element in the image.

Verifying that the first and second circuit elements are electrically disconnected can include, during removal of the defect, exposing at least one of the first and second circuit elements to a charged particle beam to cause particles to leave the substrate, and forming one or more images of the first and second circuit elements based on the particles that leave the substrate. Verifying that the first and second circuit elements are electrically disconnected can include comparing an average intensity of the first circuit element in the one or more images to an average intensity of the second circuit element in the one or more images as the defect is removed.

Verifying that the first and second circuit elements are electrically disconnected can include monitoring a change in average intensity of at least one of the first and second circuit elements in the one or more images as the defect is removed.

Removing the portion of the substrate can include forming a recess in the substrate so that the defect is positioned within the recess.

The defect can correspond to an electrical short between the first and second circuit elements.

The suspected defect can correspond to an electrical short between the first and second circuit elements. The suspected defect can correspond to an opening in a conductive path between the first and second circuit elements.

Identifying the suspected electrical defect can include exposing a region of the substrate that includes the first and second circuit elements to a charged particle beam that causes particles to leave the substrate, forming an image of the first and second circuit elements based on the particles that leave the substrate, and comparing the intensities of the first and second circuit elements in the image.

The portion of the substrate can be removed by exposing the substrate to a charged particle beam. Modifying at least a portion of the suspected defect can include removing a portion of an electrical path formed by a conductive material between the first and second circuit elements. Modifying at least a portion of the suspected defect can include depositing conductive material in a region of the substrate that includes the suspected defect to bypass an opening in a conductive path between the first and second circuit elements. Gas particles that include the conductive material can be exposed to the charged particle beam to deposit the conductive material.

Verifying that the suspected defect corresponds to a real defect can include forming one or more images of the first and second circuit elements during exposure of the suspected defect to the charged particle beam, and comparing intensities of the first and second circuit elements in the one or more images. The one or more images of the first and second circuit elements can be formed by exposing a region of the substrate that includes the first and second circuit elements to a charged particle beam that causes particles to leave the substrate, and forming the one or more images of the first and second circuit elements based on the particles that leave the substrate.

Verifying that the suspected defect corresponds to a real defect includes forming an image of the first and second circuit elements following exposure of the suspected defect to the charged particle beam, and comparing intensities of the first and second circuit elements in the image. The image of the first and second circuit elements can be formed by exposing a region of the substrate that includes the first and second circuit elements to a charged particle beam that causes particles to leave the substrate, and forming the image of the first and second circuit elements based on the particles that leave the substrate.

Forming an image of the variation in the electrical path can include exposing a portion of the substrate that includes the electrical path to a charged particle beam that causes particles to leave the substrate, and forming the image based on the particles that leave the substrate.

Removing a portion of the substrate can include forming a recess in the substrate. The recess can be adjacent to the electrical path. A portion of the electrical path can be positioned within the recess.

The variation can include a variation in a dimension of the electrical path. The variation can include an opening in the electrical path.

The method can include depositing a conductive material to form an electrical connection between the first and second circuit elements that bypasses a portion of the electrical path that includes the variation. Depositing the conductive material can include exposing a region of the substrate that includes the electrical path to a charged particle beam and to gas particles that include the conductive material.

The method can include forming one or more images of the first and second circuit elements during the depositing to verify that the electrical connection formed of the conductive material bypasses the variation in the electrical path. The method can include forming an image of the first and second circuit elements following the depositing to verify that the electrical connection formed of the conductive material bypasses the variation in the electrical path.

The conductive path can include a via that includes the defect. The conductive path can include a conducting line that includes the defect.

The first and second circuit elements can be positioned entirely within a body of the substrate.

Removing the portion of the substrate can include forming a recess in the substrate, and the method can include, after the verifying, adding material to the recess to at least partially fill the recess. Adding material to the recess can include completely filling the recess with material.

Identifying the defect can include exposing a region of the substrate body that includes the first and second circuit elements to a helium ion beam that causes particles to leave the substrate body, forming an image of the first and second circuit elements based on the particles that leave the substrate body, and comparing intensities of the first and second circuit elements in the image.

Embodiments can include one or more of the following advantages.

In some embodiments, after depositing conductive material to connect circuit elements and/or removing material to disconnect circuit elements, defect repair can be verified by measuring one or more images of the circuit elements. Verification of defect repair provides confirmation that suspected defects were true defects, and also provides confirmation that repair operations were successful.

In certain embodiments, information derived from defect repair operations, including defect verification information, can be transmitted to one or more external systems such as semiconductor wafer fabrication systems. The transmitted information can be used, for example, by a semiconductor fabrication system to guide and/or modify fabrication procedures and in particular, to modify procedures which have a high probability of producing defects in fabricated semiconductor structures.

In some embodiments, defects in electrical circuits can be exposed by removing material from regions surrounding the defect without removing material from a conductive path that includes the defect. In other words, dielectric material that surrounds the conductive path can be selectively removed, without removing portions of the conductive path. Defects in the conductive path can then be repaired, so that the electrical circuits can be returned to a functioning state. The electrical circuit elements are not rendered inoperable and/or destroyed by the removal of the dielectric material.

In certain embodiments, circuit elements can be imaged during defect repair operations. Imaging during repair can be used to guide the repair process—suggesting, for example, when repair of a particular defect is complete. In addition, imaging of circuit elements during defect repair operations can be used to confirm that certain candidate defects are indeed true defects (e.g., defect verification).

The details of one or more embodiments are set forth in the accompanying drawings and description below. Other features and advantages will be apparent from the description, drawings, and claims.

DESCRIPTION OF DRAWINGS

Like reference symbols in the various drawings indicate like elements.

DETAILED DESCRIPTION

Defects in electrical circuits, including openings in conductive pathways between circuit elements and/or short circuits between elements, can lead to irregular operation and even failure of the electrical circuits. Semiconductor devices that include integrated circuit elements are often costly and/or time-consuming to fabricate. Accordingly, when such devices include suspected defects among certain circuit elements, it may be preferable to attempt to remove the defects to yield a functional device, rather than to simply fabricate another device that does not include such defects. In addition, by locating the suspected defects (and even verifying that the suspected defects are true defects leading to the observed irregular operation of the circuits), the defect information can be used to modify manufacturing processes (e.g., in a semiconductor fabrication facility) which may be responsible for producing the defects in the fabricated devices. By altering relevant manufacturing processes, the rate at which such defects are produced can be reduced.

Figure 1A:
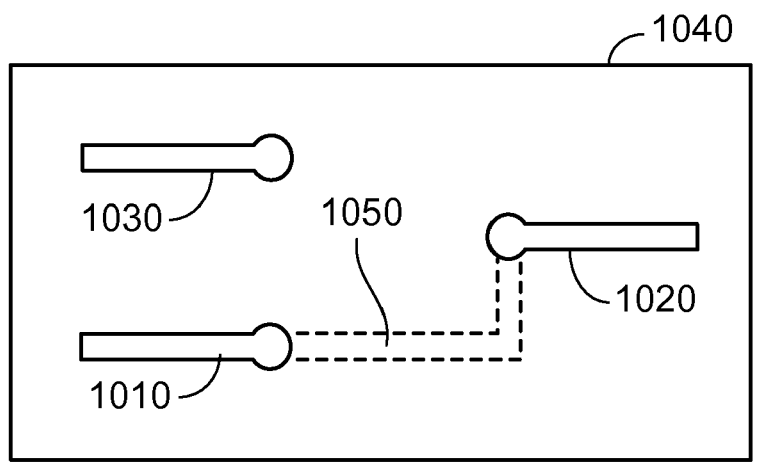
FIGS. 1A-C are schematic diagrams showing a device that includes electrical circuit elements on a substrate material.
Figure 1B:
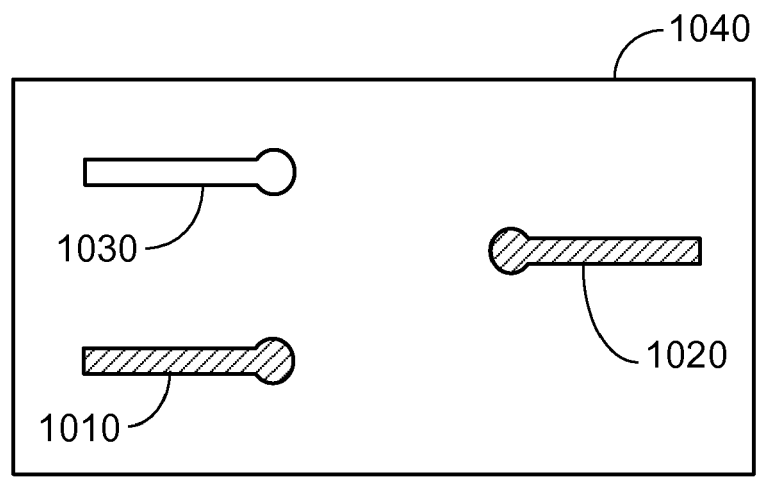
Figure 1C:
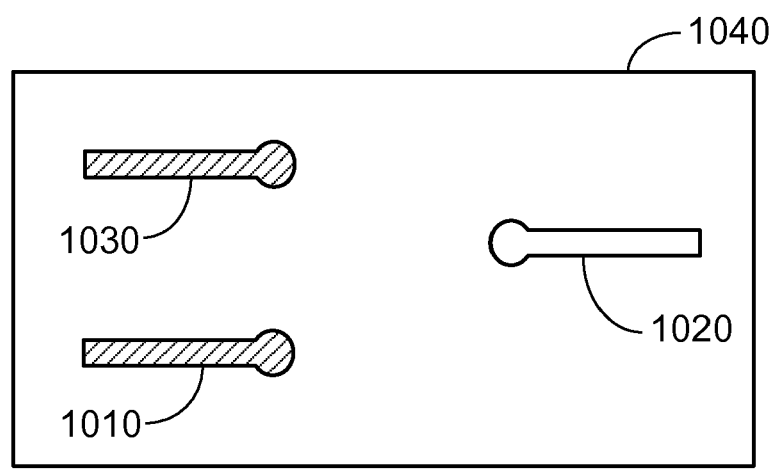

FIGS. 1A-1C are top views showing electrical circuit elements 1010, 1020, and 1030, positioned on (and extending down through) substrate 1040. A sub-surface bridge 1050 formed by vias and other conducting path elements connects circuit elements 1010 and 1020, and is shown as dotted lines in FIG. 1A. Circuit element 1030 is electrically isolated from both circuit elements 1010 and 1020.

To interrogate electrical connections between various circuit elements, the elements can be investigated using voltage contrast imaging. For example, element 1010 can be selectively exposed to a beam of charged particles to cause excess charge to accumulate on element 1010. Then, substrate 1040—including elements 1010, 1020, and 1030—can be exposed to additional charged particles, which cause a plurality of particles to leave the surface of substrate 1040 and the surfaces of elements 1010, 1020, and 1030. Some of the particles leaving the surfaces of the substrate and the circuit elements (e.g., secondary particles, scattered primary particles) can be detected and used to form an image of the circuit elements and the substrate. The charging of element 1010 changes the efficiency with which primary and/or secondary particles can leave the surface of element 1010, relative to elements 1020 and 1030 and substrate 1040, by changing the local electrical potential at the surface of element 1010. As a result, the average intensity of element 1010 in the image—which is related to the efficiency with which particles can leave the surface of element 1010—can be different from the average intensity of the other circuit elements.

As an example, in FIG. 1B, circuit element 1010 is exposed to a plurality of positively charged particles (e.g., noble gas ions, such as helium ions, neon ions, argon ions, krypton ions, and/or xenon ions), depositing excess positive charged on the surface of element 1010, and changing the local electrical potential at the surface. Substrate 1040 and circuit elements 1010, 1020, and 1030 are then exposed to a particle beam (e.g., an ion beam and/or an electron beam), and a detector is positioned to measure secondary electrons that leave substrate 1040 and circuit elements 1010, 1020, and 1030 in response to the particle beam exposure. The measured secondary electrons are used to form an image that is similar to the schematic diagram of FIG. 1B.

In FIG. 1B, positive charge accumulation on circuit element 1010 reduces the efficiency with which secondary electrons can leave element 1010 and be detected; as a result, circuit element 1010 appears darker in FIG. 1B, with relatively fewer secondary electrons leaving element 1010 and reaching the detector. In contrast, excess positive charge does not accumulate on circuit element 1030, which is not exposed to the positively charged particles. As a result, secondary electrons generated in circuit element 1030 can more easily escape the surface of element 1030 (e.g., relative to element 1010), and the signal (e.g., the mean signal intensity) measured by the detector that corresponds to circuit element 1030 is larger than the mean signal intensity that corresponds to circuit element 1010. Based on the relatively large difference between the mean intensities of elements 1010 and 1030 in FIG. 1B, it is expected that no electrical connection is present between these two elements.

Further, as shown in FIG. 1B, after element 1010 is exposed to the positively charged particles, the mean intensity of element 1020 is approximately equal to the mean intensity of element 1010. Due to sub-surface bridge 1050, elements 1010 and 1020 are at the same electrical potential, even after element 1010 is selectively exposed to positively charged particles. As a result, the efficiency with which secondary electrons leave surfaces of both elements 1010 and 1020 is reduced, so that elements 1010 and 1020 both have a reduced mean image intensity in FIG. 1B. Because the surface potentials of elements 1010 and 1020 are approximately the same, the mean intensities of these two elements is approximately the same.

Therefore, by selectively exposing certain circuit elements to positively charged particles, the electrical potential of various circuit elements in a device can be altered due to charge accumulation. Further, by forming one or more images of the device's circuit elements, voltage contrast information (e.g., variations in the mean intensity of the circuit elements in the images based on variations in electrical potential of the elements) can be used to identify which elements are electrically connected and which element are electrically isolated.

In FIG. 1C, a device similar to the device shown in FIG. 1A is fabricated. Circuit element 1010 is selectively exposed to a plurality of charged particles to cause excess charge to accumulate on element 1010. Then each of elements 1010, 1020, and 1030 is exposed to a particle beam, and secondary electrons leaving each of the elements are detected by a suitably configured detector and used to form images of the elements. As shown in FIG. 1C, element 1010 appears darker in FIG. 1C, due to accumulation of excess positive charge on element 1010 and the reduced efficiency with which secondary electrons can leave element 1010 as a result of the changed electrical potential of element 1010. However, element 1020—which is nominally connected to element 1010—has a higher mean intensity in the image of the device, implying that element 1020 is at a different electrical potential from element 1010. The differing electrical potentials between elements 1010 and 1020 suggests that these elements, which are supposed to be electrically connected via bridge 1050, are not connected properly to one another. Instead, the differing mean intensities of the elements in the image suggests that at least one defect is present along the electrical pathway (e.g., bridge 1050) that connects elements 1010 and 1020.

Circuit element 1030 has an average intensity in the image of the device that is smaller than expected for an electrically isolated element that was not exposed to the plurality of charging particles. In particular, it is observed that the mean intensity of element 1030 is similar to the mean intensity of element 1010, suggesting that an electrical connection (e.g., an electrical short) exists between elements 1010 and 1030, even though, nominally, no such connection is supposed to exist. Thus, by analyzing voltage contrast information (e.g., the mean intensities of various circuit elements in images), suspected defects such as electrical shorts between circuit elements can be identified.

Figure 2A:
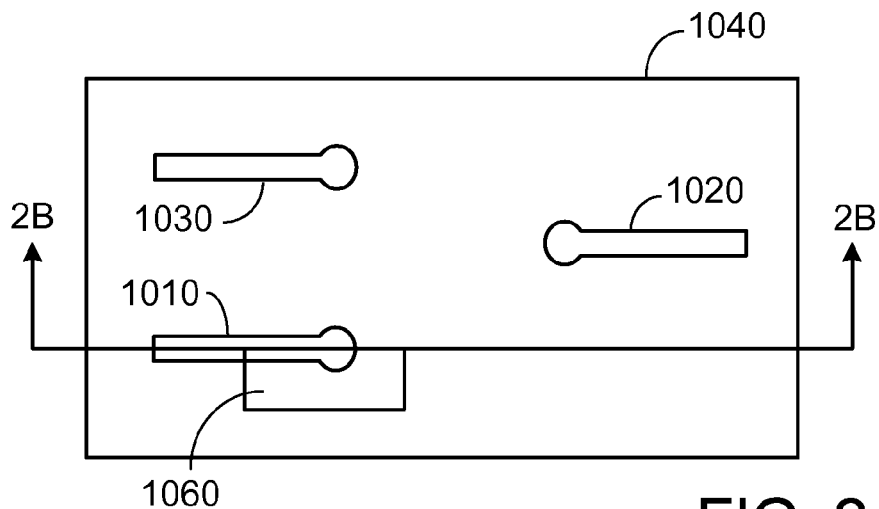
FIGS. 2A and 2B are schematic diagrams showing a top view and a cross-sectional view, respectively, of a trench milled in one of the circuit elements of the device shown in FIG. 1A.

In certain methods, to attempt to locate the position of a defect such as an interruption in a conductive path between circuit elements and/or an electrical short between circuit elements, a trench is milled (e.g., using an ion beam device such as a gallium field ion beam (FIB)) through a circuit element that is suspected to include the defect. FIG. 2A shows the same device as in FIG. 1C, where a gallium FIB is used to mill a trench 1060 downward through circuit element 1010 to try to expose the suspected defect.

Figure 2B:
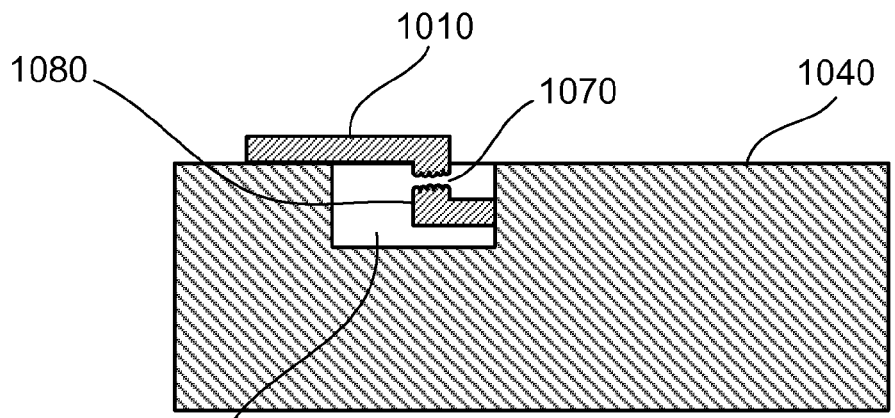

FIG. 2B shows a portion of the milled trench of FIG. 2A in cross-section. In FIG. 2B, a defect 1070 (e.g., a break) is positioned along a via that forms a part of bridge 1050 that connects elements 1010 and 1020. By milling the device to form trench 1060 and then imaging the milled region (e.g., by exposing the milled region to a particle beam and detecting particles such as secondary electrons that leave the milled region in response to the particle beam), defect 1070 can be located in images of the milled region.

However, by milling through element 1010 as shown in FIGS. 2A and 2B, the functionality of circuit element 1010—and therefore, potentially of one or more circuits that include element 1010—is typically destroyed. That is, although it may be possible to locate defect 1070 by milling as shown in FIGS. 2A and 2B, the milled device's functionality is typically reduced or eliminated by the milling operation.

In addition, while the milling operation shown in FIGS. 2A and 2B can help to identify a suspected defect such as defect 1070, no verification is provided that defect 1070 is, in fact, the defect that causes an observed circuit failure (e.g., the disconnect between circuit elements 1010 and 1020). Because circuit element 1010 is no longer functional after the milling operation, it is difficult to determine whether an observed suspected defect 1070 is a true defect, or simply a fabrication irregularity which nonetheless does not significantly impair the functioning of the device.

The methods disclosed herein provide for non-destructive defect identification, so that circuit operation is not impaired during modification of (e.g., material removal from) the device. Further, because circuit operation is not impaired and individual circuit elements are not destroyed by the modification steps, the methods disclosed herein permit repair of suspected defects, and subsequent verification that the repaired suspected defects were indeed true defects responsible for irregular operation of the circuit.

In the first section of this disclosure, systems and methods for defect identification, repair, and verification are disclosed. In the second section of the disclosure, systems and methods for producing ion beams and detecting particles that leave samples exposed to ion beams are disclosed.

In the following disclosure, reference is made to exposing samples (e.g., such as devices that include circuit elements) to ions to remove material from the device, and to cause particles to leave the device which are then detected by a suitable detector. Particles which are detected in the following disclosure are typically secondary electrons. In general, however, a variety of different charged particles (including, for example, one or more different types of ions, and/or electrons) can be used to remove material from the device in one or more milling operations, and/or during imaging of the device (e.g., to cause particles to leave the device). Further, in general, a variety of different particles leaving the device can be detected and used to form images of the device. The detected particles can include one or more of secondary electrons, scattered primary ions, secondary ions, photons, and neutral particles.

Defect Repair Systems and Methods

Figure 3A:
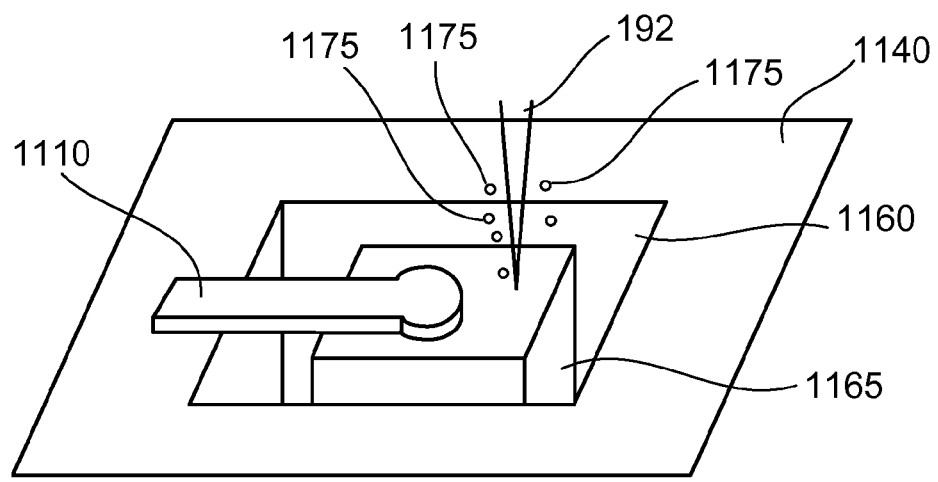
FIGS. 3A and 3B are schematic diagrams showing removal of substrate material from a region surrounding a circuit element.

The defect repair methods disclosed herein typically include a first step of removing material from a region of the device that surrounds a suspected defect, without removing material from the circuit element(s) that include the defect (e.g., without directly milling the circuit elements, as in FIGS. 2A and 2B). FIG. 3A shows a device that includes a substrate 1140 and a circuit element 1110 that is suspected to include a defect. As shown in FIG. 3A, the device is exposed to ions (e.g., from a field ion source such as a helium ion source and/or from a source such as a gallium liquid metal ion source) to remove material from the substrate in a region surrounding the suspected defect. However, as shown in FIG. 3A, not all substrate material in the region surrounding the suspected defect is removed. A portion 1165 of the substrate material surrounding the suspected defect is not removed, to reduce the likelihood of damage to element 1110 from the milling operation.

In a second step, portion 1165 of the substrate material is removed by selective beam-induced chemical steps to expose element 1110 and its suspected defect, without removing any significant portions of element 1110 (and therefore, without destroying the functionality of element 1110). Methods for beam-induced chemical etching are disclosed, for example, in U.S. Patent Application Publication No. US 2007/0158558, the entire contents of which are incorporated herein by reference.

Figure 3B:
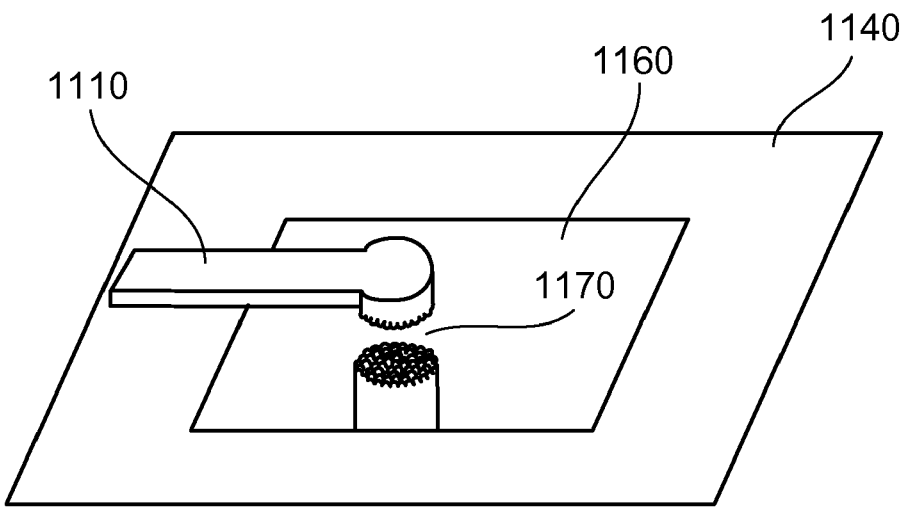

In beam-induced chemical etching, particles of a suitable reactive gas 1175 are introduced into the vicinity of an ion beam 192 that is incident on the device. Typically, for example, a noble gas ion beam such as a helium ion beam is used to expose portion 1165 of the substrate material. Reactive gas particles 1175 are introduced into the vicinity of ion beam 192 and interact with secondary electrons generated by the ion beam in a sample (e.g., the semiconductor device), activating the reactive gas particles in the vicinity of the ion beam. The reactive gas particles then react with and remove the remaining portion 1165 of the substrate material, leaving circuit element 1110 essentially undamaged and exposing the suspected defect 1170. FIG. 3B shows the device of FIG. 3A after beam-induced chemical etching to remove portion 1165 of the substrate material; suspected defect 1170, positioned within substrate 1140, is exposed following the etching step.

The reactive gas that is used in the etching step is typically selected so that activated gas particles selectively react with the substrate material, leaving circuit elements such as element 1110, which are typically formed from materials that are different from the substrate, essentially unmodified. As an example, to remove portions of a silicon substrate that surround circuit elements formed of one or more metals such as copper, silver, gold, or aluminum, the substrate can be exposed to a helium ion beam in the presence of a reactive gas such as $Cl_2$, $O_2$, $I_2$, $XeF_2$, $F_2$, $CF_4$ and $H_2O$. As an example, in certain embodiments, portions of the substrate can be partially removed by interacting secondary electrons with $XeF_2$, $F_2$ and/or $CF_4$, and allowing the resulting chemical species to etch the substrate. As a further example, in certain embodiments, a substrate formed of a carbon-containing material can be at least partially removed by interacting secondary electrons with $H_2O$ and/or $O_2$, and allowing the resulting chemical species to etch the substrate.

Once suspected defect 1170 has been exposed, the defect can be repaired. In some embodiments, as shown in FIG. 3B, suspected defect 1170 corresponds to an opening formed in a conductive path between circuit elements. To repair suspected defect 1170, a conductive bypass can be deposited, restoring electrical conductivity to the path between the elements.

Figure 4:
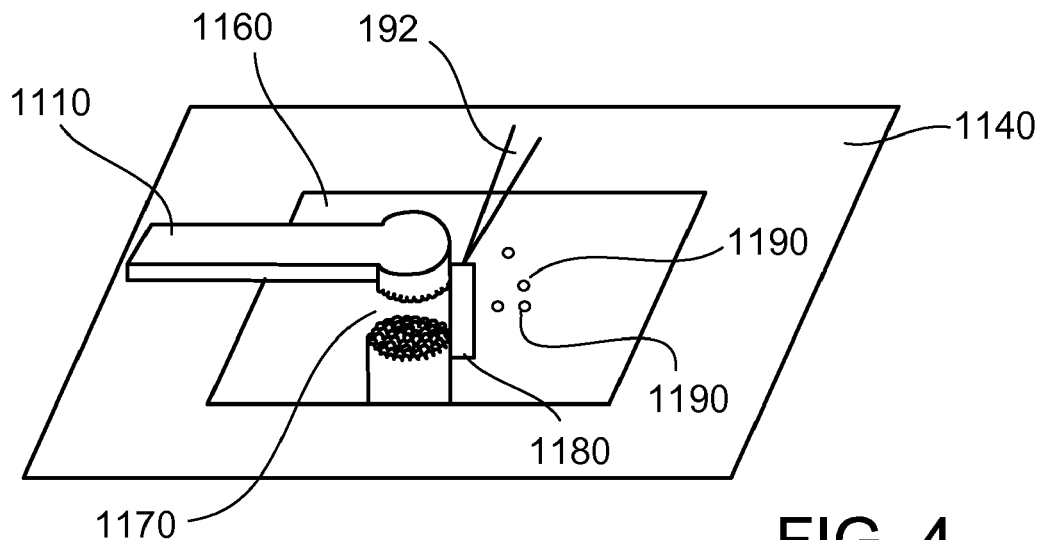
FIG. 4 is a schematic diagram showing a conductive bypass deposited to bridge an opening in a conductive path between circuit elements.

FIG. 4 shows the device of FIG. 3B, where a conductive bypass 1180 has been deposited to bridge suspected defect 1170, thereby restoring electrical connectivity to the path that connects circuit element 1110 to other circuit elements. Conductive bypass 1180 can be deposited by directing a beam of ions 192 (e.g., helium ions) to be incident on a region of the path in the vicinity of suspected defect 1170, and introducing suitable reactive gas particles 1190 in the vicinity of the ion beam. Reactive gas particles 1190 interact with ion beam 192, activating the gas particles. The activated gas particles then deposit a layer of conductive material (e.g., conductive bypass 1180) in the vicinity of ion beam 192.

In general, a wide variety of different reactive gases can be used to deposit conductive bypass 1180, depending upon the material of the conductive bypass. Commonly used materials for conductive elements include metals such as copper, silver, aluminum, gold, platinum, tungsten, and other metals. Conductive elements can also include conductive non-metals such as carbon. For example, gases such as Cu(hfac)TMVS can be used to deposit a conductive bypass formed of copper during exposure of the conductive path to a helium ion beam. As another example, gases such as tungsten hexacarbonyl can be used to deposit a conductive bypass formed of tungsten during ion beam exposure of the conductive path. As a further example, gases such as methylcyclopentadienyl(trimethyl) platinum can be used to deposit a conductive bypass formed of platinum during ion beam exposure of the conductive path. As another example, gases such as styrene or naphthalene can be used to deposit a conductive bypass formed of carbon during ion beam exposure of the conductive path.

Suspected defect 1170 in FIG. 4 is an opening in a conductive path between circuit elements that is bridged by conductive bypass 1180. In FIG. 4, defect 1170 is an opening in a via formed between circuit element 1110 and another conductive element. In general, defect 1170 can be an opening in any conductive path between circuit elements, including an opening in a via as shown, an opening in a conducting line (e.g., extending in a plane parallel to the plane of circuit element 1110), and/or an opening in a conductive element and/or path that extends at an angle to circuit element 1110 in either or both of the lateral direction and the vertical direction in FIG. 4.

Figure 5A:
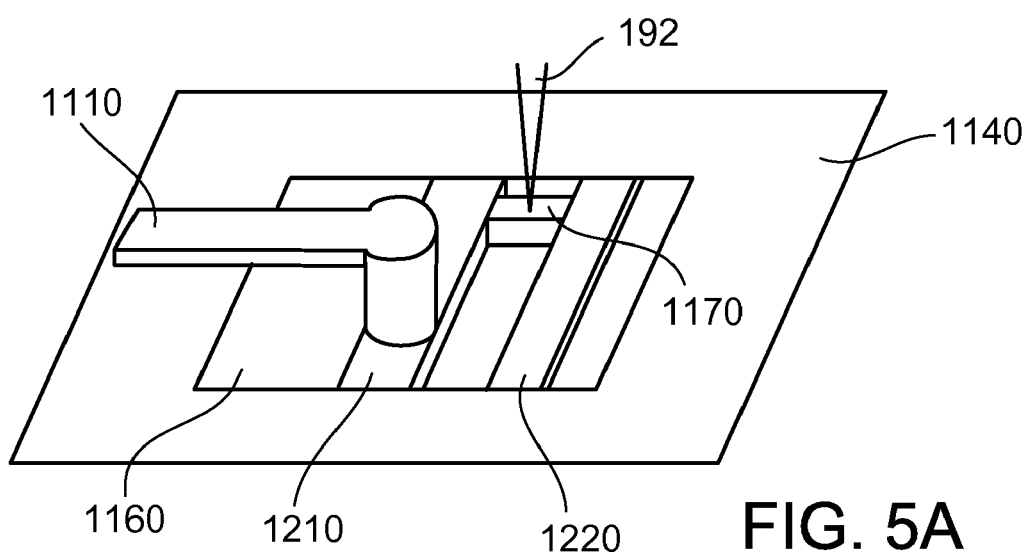
FIGS. 5A and 5B are schematic diagrams showing removal of an electrical short between circuit elements.

Further, in general, other types of suspected defects can also be repaired following exposure of the suspected defects by removing substrate material. For example, in certain embodiments, suspected defect 1170 can be an electrical short between circuit elements. FIG. 5A shows a circuit element 1110 that is connected to another circuit element 1210 that is positioned within substrate 1140. Circuit element 1210 is exposed when trench 1160 is formed in the substrate material. As shown in FIG. 5A, a suspected defect 1170 corresponding to an electrical short is positioned between circuit element 1210 and another circuit element 1220 which is also positioned within substrate 1140. A defect corresponding to an electrical short can produce a voltage contrast image where, as shown in FIG. 1C, two different circuit elements (e.g., elements 1010 and 1030) appear to be connected even though no electrical connection should be present between the elements.

Figure 5B:
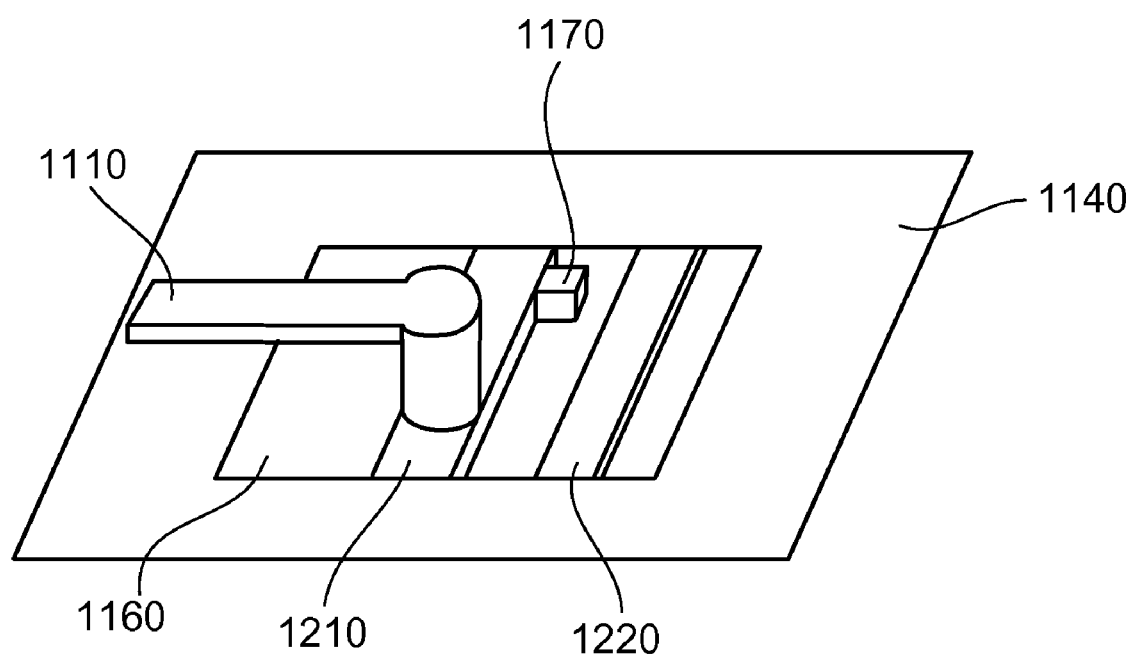

To repair a defect corresponding to an electrical short, a portion of the suspected defect can be removed by milling with an ion beam. For example, as shown in FIG. 5A, ion beam 192 (e.g., from a field ion source such as a noble gas ion source and/or from a liquid metal ion source such as a gallium ion source) is incident on suspected defect 1170 and removes a portion (or all) of the suspected defect in a milling operation. By removing a portion of suspected defect 1170, as shown in FIG. 5B, circuit elements 1210 and 1220 are electrically disconnected. Electrical shorts can generally be positioned between any of various conductive elements in a circuit, including vias, conductive lines, and circuit elements. The methods disclosed herein can be used to repair shorts that form conductive paths between any of these various types of elements.

To provide verification that suspected defect 1170 is, in fact, responsible for the irregular behavior of circuit elements in voltage contrast images (e.g., the apparent absence of an electrical connection between elements 1010 and 1020 in FIG. 1C, and/or the apparent presence of an electrical connection between elements 1010 and 1030), various circuit elements can be exposed to a plurality of charged particles to deposit excess charge on the circuit elements, and then one or more images of the device's circuit elements can be obtained as described above in connection with FIGS. 1A-1C. Voltage contrast in the one or more images of the circuit elements can be used to provide verification that repaired suspected defects corresponded to true defects, and were responsible for the observed voltage contrast in previous images of the circuit elements.

For example, with reference to FIGS. 1B and 1C, if a suspected defect corresponding to an opening in a sub-surface electrical path between element 1010 and 1020 is repaired and an image of circuit elements 1010 and 1020 that includes voltage contrast information is subsequently obtained, the two elements should appear as in FIG. 1B—that is, the two elements should have similar mean intensity values in the image, suggesting that the electrical connection between the elements has been restored. Comparing the image of the elements following repair to the image of the elements prior to repair (e.g., FIG. 1C), in which elements 1010 and 1020 have significantly different mean intensity values, provides verification that the suspected defect which was repaired was responsible for the inferred absence of the electrical connection between the elements.

If the suspected defect corresponds to an electrical short between circuit elements, as FIG. 1C implies with regard to elements 1010 and 1030, then an image of circuit elements 1010 and 1030 that includes voltage contrast information, following repair of the suspected defect, should appear as in FIG. 1B—the two elements should have significantly different mean intensity values, implying that they are no longer electrically connected. Comparing the mean intensities of elements 1010 and 1030 in FIG. 1C (prior to repair) and FIG. 1B (following repair) provides verification that the repair suspected defect was responsible for the inferred electrical connection between elements 1010 and 1030.

In the discussion above, one or more images of the sample (e.g., a semiconductor device that includes circuit elements) are obtained following one or more repair operations to verify that the repaired suspected defect was a real defect responsible for irregular operation of the device. In some embodiments, however, the device can be imaged during repair of suspected defects, to guide the repair process and to provide more rapid verification of circuit repair. For example, as conductive bypass 1180 is deposited, updated images of circuit elements that include voltage contrast information can be obtained. If the circuit elements are initially electrically disconnected as the repair operation begins (e.g., elements 1010 and 1020 in FIG. 1C) and therefore have significantly different mean intensities, then as the repair operation proceeds, the mean intensities of the elements should become more similar in the updated images. The repair operation can be continued, monitoring changes in mean intensity of the elements, until a suitable correspondence between the mean intensity values of the elements is obtained.

As another example, where an electrical short exists between circuit elements, updated images of the circuit elements can be obtained during removal of a portion of the short. If the circuit elements initially have comparable mean intensity values in voltage contrast images, then as the repair operation proceeds, the mean intensity values of the elements should become increasingly dissimilar. By monitoring changes in the mean intensity values of the circuit elements, the repair operation can be continued until the elements are suitably disconnected electrically.

Repaired defects are part of electrical circuits which are, in turn, part of an electrical device. Following defect repair, the device can be returned to, or put into, service. Prior to putting the device into service, however, in some embodiments, one or more trenches 1160 that were formed in the device as part of the defect repair operation can be filled in (e.g., with substrate material) to seal the circuit elements within the substrate. A variety of different methods can be used to fill in trenches formed in the device. For example, in certain embodiments, the device can be exposed to a beam of charged particles (e.g., electrons or ions) and reactive gas particles can be introduced in the vicinity of the charged particle beam. The reactive gas particles interact with the particle beam, activating the gas particles. The activated gas particles then deposit substrate material in the vicinity of the charged particle beam. By selectively positioning the charged particle beam within trenches 1160, the trenches can be filled with substrate material, sealing the repaired defects within the body of the substrate material. By filling in trenches 1160 to close openings to the interior of the device, water and other contaminants can be prevented from entering the device and causing deleterious effects. Methods for depositing substrate material via reactive gas particles are generally disclosed, for example, in U.S. Patent Application Publication No. US 2007/0158558.

The methods disclosed herein can generally be applied to repair suspected defects in many different types of circuit elements. Defects can be located between circuit elements that are positioned in a common plane of the substrate, for example. More generally, however, defects can be located between any combination of circuit elements positioned on and/or in a substrate, including circuit elements that are positioned in different planes of the substrate.

As discussed above, exemplary defects include openings in electrical paths between circuit elements and electrical shorts between circuit elements. More generally, defects can include a wide variety of shape variations of circuit elements that correspond to deviations from specified geometries of the elements in design specifications. For example, defects can include variations in dimensions of electrical paths between circuit elements, and can result not only in the absence of, or presence of, electrical conductivity along a selected path, but also, more generally, in a decrease or increase of electrical conductivity along the path.

Defects can also generally include non-conductivity-related defects such as variations in local structure of circuit elements and/or the substrate. For such defects, imaging methods other than voltage contrast imaging can be used to obtain images that suggest the presence of the defects, and to verify that the defects have been repaired. In general, the methods disclosed herein can be used to expose such suspected defects, to repair the defects, and to verify that the defects were real defects, according to steps that are similar to those discussed above for conductivity-related suspected defects.

In general, imaging of devices and material removal (e.g., milling, beam-induced etching) can be performed using a single beam of charged particles, or multiple charged particle beams. For example, in some embodiments, a first ion beam such as a helium ion beam can be used to obtain images of circuit elements of a device, and for ion beam-induced chemical etching to remove portions (e.g., portion 1165) of the substrate. A second ion beam such as a gallium ion beam can be used for milling operations (e.g., to remove substrate material to form trench 1160 and/or to remove electrical shorts as in FIGS. 5A and 5B.

In certain embodiments, a single ion beam can be used for imaging, beam-induced chemical etching, and milling operations. For example, a noble gas ion beam (e.g., a helium ion beam, a neon ion beam, an argon ion beam, or a krypton ion beam) can be used to perform each of these operations. Helium ions provide a particular advantage when obtaining images that include voltage contrast information, as helium ion beams are capable of acquiring images that include sub-surface voltage contrast information (e.g., variations in image intensity that result from different local electrical potentials of sub-surface elements) as well as surface voltage contrast information. The use of helium ion beams therefore permits interrogation of circuit elements that might otherwise be difficult to access and/or might require removal of substrate material to interrogate.

For example, in certain embodiments, a helium ion beam can be used to obtain one or more voltage contrast images of circuit elements similar to circuit elements 1010, 1020, and 1030 of FIGS. 1A-1C, but which are positioned entirely within substrate 1040 (e.g., the circuit elements do not have an exposed face at the surface of substrate 1040). Helium ion imaging methods can be used to locate suspected defects such as openings and/or electrical shorts in conductive paths between the circuit elements without removing substrate material (e.g., without milling). As a result, various types of suspected defects that would be otherwise difficult to identify using standard voltage contrast imaging techniques can be identified using the methods disclosed herein. Following identification, the suspected defects can then be repaired according to the procedure discussed previously (e.g., by removing substrate material to expose the suspected defects, and then depositing conductive material to bridge opens and/or removing material from electrical shorts).

In some embodiments, more than two charged particle beams can be used. For example, different charged particle beams can be used for imaging circuit elements, for beam-induced chemical etching, and for material removal via milling.

Moreover, the charged particle beams used for imaging, beam-induced chemical etching, and/or milling, can generally include one or more different types of charged particles. For example, the charged particle beams can include a wide variety of different types of ions, including combinations of different types of ions. In certain embodiments, charged particle beams can include electrons. Electron beams may be particularly suitable for operations such as device imaging to obtain voltage contrast information and/or beam-induced chemical etching.

In some embodiments, the methods disclosed herein include obtaining information about the nature and location of defects to guide device fabrication. For example, once a suspected defect 1170 has been exposed as shown in FIG. 3B, the suspected defect can be imaged (e.g., by directing charged particles from a source such as an ion beam or electron beam to be incident on the suspected defect, and detecting particles that leave the region of the suspected defect in response to the incident charged particles). From the image(s) of the defect, the defect position can be determined, and the defect can be provisionally classified into one of a number of different types. The position determination and defect classification can be performed manually by a system operator, or in automated fashion by an electronic processor.

Following repair and verification that the suspected defect was a real defect responsible for the observed irregular behavior of a circuit element, information relating to the defect's position and type can be transmitted to a semiconductor fabrication system (e.g., a fabrication line controller). The fabrication system can, for example, alter one or more fabrication process parameters to reduce the likelihood of producing similar defects in subsequently-fabricated devices. Alternatively, or in addition, the fabrication system can use the defect-related information to perform statistical analysis of typical device fabrication errors.

Ion Beam Systems

This section of the disclosure relates to systems and methods for producing ion beams, and detecting particles including secondary electrons and scattered ions that leave a sample of interest (e.g., a semiconductor device that includes various circuit elements) due to exposure of the sample to an ion beam. The systems and methods can be used to obtain one or more images of the sample.

Typically, gas ion beams that are used to interrogate samples are produced in multipurpose microscope systems. Microscope systems that use a gas field ion source to generate ions that can be used in sample analysis (e.g., imaging) are referred to as gas field ion microscopes. A gas field ion source is a device that includes an electrically conductive tip (typically having an apex with 10 or fewer atoms) that can be used to ionize neutral gas species to generate ions (e.g., in the form of an ion beam) by bringing the neutral gas species into the vicinity of the electrically conductive tip (e.g., within a distance of about four to five angstroms) while applying a high positive potential (e.g., one kV or more relative to the extractor (see discussion below)) to the apex of the electrically conductive tip.

Figure 6:
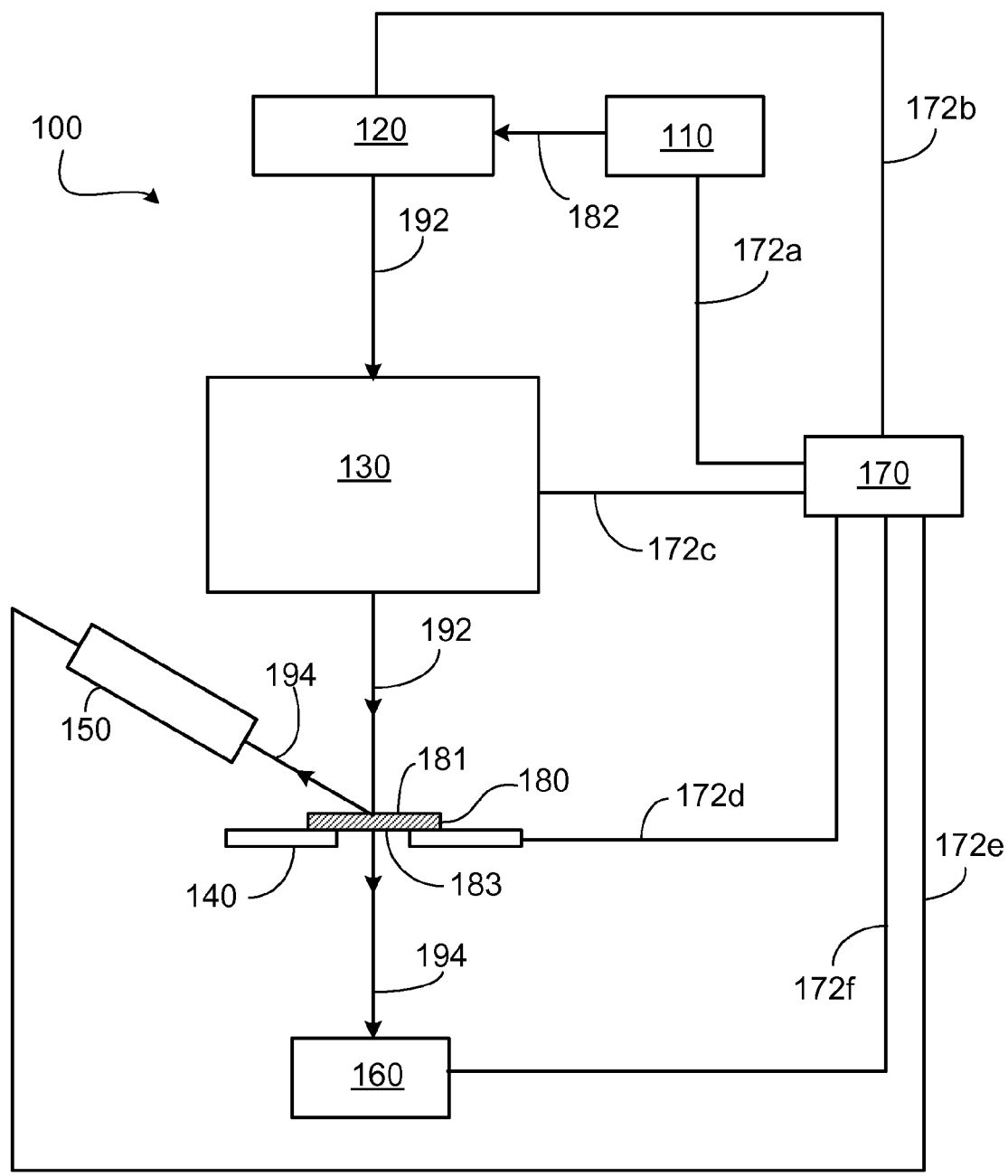
FIG. 6 is a schematic diagram of an ion microscope system.

FIG. 6 shows a schematic diagram of a gas field ion microscope system 100 that includes a gas source 110, a gas field ion source 120, ion optics 130, a sample manipulator 140, a front-side detector 150, a back-side detector 160, and an electronic control system 170 (e.g., an electronic processor, such as a computer) electrically connected to various components of system 100 via communication lines 172a-172f. A sample 180 is positioned in/on sample manipulator 140 between ion optics 130 and detectors 150, 160. During use, an ion beam 192 is directed through ion optics 130 to a surface 181 of sample 180, and particles 194 resulting from the interaction of ion beam 192 with sample 180 are measured by detectors 150 and/or 160.

Figure 7:
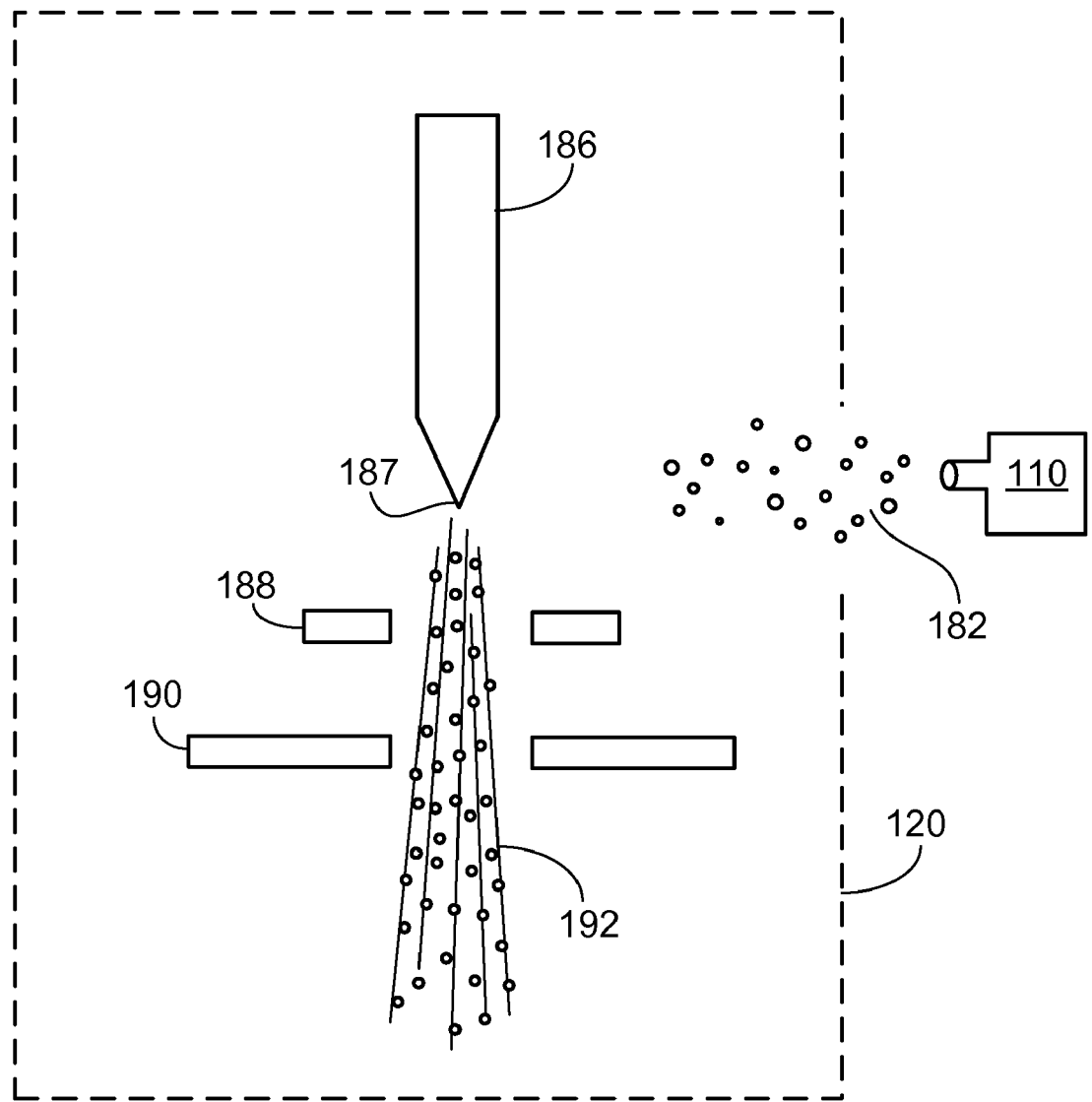
FIG. 7 is a schematic diagram of a gas field ion source.

As shown in FIG. 7, gas source 110 is configured to supply one or more gases 182 to gas field ion source 120. Gas source 110 can be configured to supply the gas(es) at a variety of purities, flow rates, pressures, and temperatures. In general, at least one of the gases supplied by gas source 110 is a noble gas (helium (He), neon (Ne), argon (Ar), krypton (Kr), xenon (Xe)), and ions of the noble gas are desirably the primary constituent in ion beam 192.

Optionally, gas source 110 can supply one or more gases in addition to the noble gas(es); an example of such a gas is nitrogen. Typically, while the additional gas(es) can be present at levels above the level of impurities in the noble gas(es), the additional gas(es) still constitute minority components of the overall gas mixture introduced by gas source 110.

Gas field ion source 120 is configured to receive the one or more gases 182 from gas source 110 and to produce gas ions from gas(es) 182. Gas field ion source 120 includes an electrically conductive tip 186 with a tip apex 187, an extractor 190 and optionally a suppressor 188.

Electrically conductive tip 186 can be formed of various materials. In some embodiments, tip 186 is formed of a metal (e.g., tungsten (W), tantalum (Ta), iridium (Ir), rhenium (Rh), niobium (Nb), platinum (Pt), molybdenum (Mo)). In certain embodiments, electrically conductive tip 186 can be formed of an alloy. In some embodiments, electrically conductive tip 186 can be formed of a different material (e.g., carbon (C)).

During use, tip 186 is biased positively (e.g., approximately 20 kV) with respect to extractor 190, extractor 190 is negatively or positively biased (e.g., from −20 kV to +50 kV) with respect to an external ground, and optional suppressor 188 is biased positively or negatively (e.g., from −5 kV to +5 kV) with respect to tip 186. Because tip 186 is formed of an electrically conductive material, the electric field of tip 186 at tip apex 187 points outward from the surface of tip apex 187. Due to the shape of tip 186, the electric field is strongest in the vicinity of tip apex 187. The strength of the electric field of tip 186 can be adjusted, for example, by changing the positive voltage applied to tip 186. With this configuration, un-ionized gas atoms 182 supplied by gas source 110 are ionized and become positively-charged ions in the vicinity of tip apex 187. The positively-charged ions are simultaneously repelled by positively charged tip 186 and attracted by negatively charged extractor 190 such that the positively-charged ions are directed from tip 186 into ion optics 130 as ion beam 192. Suppressor 188 assists in controlling the overall electric field between tip 186 and extractor 190 and, therefore, the trajectories of the positively-charged ions from tip 186 to ion optics 130. In general, the overall electric field between tip 186 and extractor 190 can be adjusted to control the rate at which positively-charged ions are produced at tip apex 187, and the efficiency with which the positively-charged ions are transported from tip 186 to ion optics 130.

In general, ion optics 130 are configured to direct ion beam 192 onto surface 181 of sample 180. Ion optics 130 can, for example, focus, collimate, deflect, accelerate, and/or decelerate ions in beam 192. Ion optics 130 can also allow only a portion of the ions in ion beam 192 to pass through ion optics 130. Generally, ion optics 130 include a variety of electrostatic and other ion optical elements that are configured as desired. By manipulating the electric field strengths of one or more components (e.g., electrostatic deflectors) in ion optics 130, ion beam 192 can be scanned across surface 181 of sample 180. For example, ion optics 130 can include two deflectors that deflect ion beam 192 in two orthogonal directions. The deflectors can have varying electric field strengths such that ion beam 192 is rastered across a region of surface 181.

When ion beam 192 impinges on sample 180, a variety of different types of particles 194 can be produced. These particles include, for example, secondary electrons, Auger electrons, secondary ions, secondary neutral particles, primary neutral particles, scattered ions and photons (e.g., X-ray photons, IR photons, visible photons, UV photons). Detectors 150 and 160 are positioned and configured to each measure one or more different types of particles resulting from the interaction between ion beam 192 and sample 180. As shown in FIG. 7, detector 150 is positioned to detect particles 194 that originate primarily from surface 181 of sample 180, and detector 160 is positioned to detect particles 194 that emerge primarily from surface 183 of sample 180 (e.g., transmitted particles). In general, any number and configuration of detectors can be used in the microscope systems disclosed herein. In some embodiments, multiple detectors are used, and some of the multiple detectors are configured to measure different types of particles. In certain embodiments, the detectors are configured to provide different information about the same type of particle (e.g., energy of a particle, angular distribution of a given particle, total abundance of a given particle). Optionally, combinations of such detector arrangements can be used.

In general, the information measured by the detectors is used to determine information about sample 180. Typically, this information is determined by obtaining one or more images of sample 180. By rastering ion beam 192 across surface 181, pixel-by-pixel information about sample 180 can be obtained in discrete steps. Detectors 150 and/or 160 can be configured to detect one or more different types of particles 194 at each pixel.

The operation of microscope system 100 is typically controlled via electronic control system 170. For example, electronic control system 170 can be configured to control the gas(es) supplied by gas source 110, the temperature of tip 186, the electrical potential of tip 186, the electrical potential of extractor 190, the electrical potential of suppressor 188, the settings of the components of ion optics 130, the position of sample manipulator 140, and/or the location and settings of detectors 150 and 160. Optionally, one or more of these parameters may be manually controlled (e.g., via a user interface integral with electronic control system 170). Additionally or alternatively, electronic control system 170 can be used (e.g., via an electronic processor, such as a computer) to analyze the information collected by detectors 150 and 160 and to provide information about sample 180 (e.g., topography information, material constituent information, crystalline information, voltage contrast information, optical property information, magnetic information), which can optionally be in the form of an image, a graph, a table, a spreadsheet, or the like. Typically, electronic control system 170 includes a user interface that features a display or other kind of output device, an input device, and a storage medium.

In some embodiments, electronic control system 170 can be configured to control additional devices. For example, electronic control system 170 can be configured to regulate a supply (e.g., control flow rate and/or gas composition) of a reactive gas delivered to sample 180 in the vicinity of ion beam 192. The reactive gas can be used, for example, in one or more beam-induced chemical etching operations to selectively remove substrate material, without significantly altering circuit elements as shown in FIGS. 3A and 3B. The reactive gas can also be used to deposit conductive material to bypass openings in electrical paths between elements, as shown in FIG. 4. Generally, system 100 can include one or more sources of reactive gases, each of which can be controlled by electronic control system 170.

Detectors 150 and 160 are depicted schematically in FIG. 7, with detector 150 positioned to detect particles from surface 181 of sample 180 (the surface on which the ion beam impinges), and detector 160 positioned to detect particles from surface 183 of sample 180. In general, a wide variety of different detectors can be employed in microscope system 200 to detect different particles, and microscope system 200 can typically include any desired number of detectors. The configuration of the various detector(s) can be selected in accordance with particles to be measured and the measurement conditions. In some embodiments, a spectrally resolved detector can be used. Such detectors are capable of detecting particles of different energy and/or wavelength, and resolving the particles based on the energy and/or wavelength of each detected particle.

Ion beam systems and methods are generally disclosed, for example, in U.S. Patent Application Publication No. US 2007/0158558.

Computer Hardware and Software

In general, any of the methods (or portions thereof, such as imaging steps, beam-induced etching steps, milling steps, and/or material deposition steps) described above can be implemented and/or controlled in computer hardware or software, or a combination of both. The methods can be implemented in computer programs using standard programming techniques following the methods and figures described herein. Program code is applied to input data to perform the functions described herein and generate output information. The output information is applied to one or more output devices such as a display monitor. Each program may be implemented in a high level procedural or object oriented programming language to communicate with a computer system. However, the programs can be implemented in assembly or machine language, if desired. In any case, the language can be a compiled or interpreted language. Moreover, the program can run on dedicated integrated circuits preprogrammed for that purpose.

Each such computer program is preferably stored on a storage medium or device (e.g., ROM or magnetic diskette) readable by a general or special purpose programmable computer, for configuring and operating the computer when the storage media or device is read by the computer to perform the procedures described herein. The computer program can also reside in cache or main memory during program execution. The methods or portions thereof can also be implemented as a computer-readable storage medium, configured with a computer program, where the storage medium so configured causes a computer to operate in a specific and predefined manner to perform the functions described herein.

Other embodiments are in the claims.

What is claimed is:

1. A method, comprising:
identifying a defect causing an absence of an electrical connection between a first circuit element and a second circuit element, the first and second circuit elements being positioned in or on a substrate and the defect being positioned in the substrate;
removing a portion of the substrate to expose the defect;
after exposing the defect, depositing a conductive material to electrically connect the first and second circuit elements; and
verifying that the defect caused the absence of an electrical connection between the first and second circuit elements.

2. The method of claim 1, further comprising identifying the defect by obtaining an image of the first and second circuit elements comprising voltage contrast information.

3. The method of claim 1, wherein identifying the defect comprises exposing the first and second circuit elements to a charged particle beam to cause particles to leave the substrate, and forming an image of the first and second circuit elements based on the particles that leave the substrate.

4. The method of claim 3, wherein identifying the defect further comprises identifying a difference in intensity between the first and second circuit elements in the image.

5. The method of claim 3, wherein the charged particle beam is an ion beam.

6. The method of claim 1, wherein the first and second circuit elements comprise lines of conductive material, and the defect is positioned along a conductive path between the first and second circuit elements.

7. The method of claim 1, wherein the first and second circuit elements are positioned in a common plane of the substrate.

8. The method of claim 1, wherein the first and second circuit elements are positioned in different planes of the substrate.

9. The method of claim 1, wherein removing a portion of the substrate to expose the defect further comprises exposing a region of the substrate comprising the defect to a charged particle beam to cause particles to leave the exposed region, and forming an image of the exposed region based on the particles that leave the region.

10. The method of claim 9, wherein the charged particle beam comprises ions.

11. The method of claim 1, wherein depositing the conductive material comprises directing a charged particle beam to be incident on the substrate, and directing gas molecules to be incident on the substrate in the same region as the charged particle beam.

12. The method of claim 1, wherein depositing the conductive material comprises directing a charged particle beam to interact with a stream of gas molecules to deposit the conductive material to connect the first and second circuit elements.

13. The method of claim 1, wherein verifying that the defect caused the absence of an electrical connection between the first and second circuit elements comprises, after depositing the conductive material, exposing at least one of the first and second circuit elements to a charged particle beam to cause particles to leave the substrate, and forming an image of the first and second circuit elements based on the particles that leave the substrate.

14. The method of claim 1, wherein verifying that the defect caused the absence of an electrical connection between the first and second circuit elements comprises, during deposition of the conductive material, exposing at least one of the first and second circuit elements to a charged particle beam to cause particles to leave the substrate, and forming one or more images of the first and second circuit elements based on the particles that leave the substrate.

15. The method of claim 1, wherein the portion of the substrate is removed without removing any portion of an electrical path comprising the defect.

16. The method of claim 1, wherein the defect comprises an opening in an electrical path between the first and second circuit elements.

17. The method of claim 1, wherein the defect comprises a variation in at least one dimension of an electrical path between the first and second circuit elements.

18. The method of claim 1, further comprising providing information about the defect to a semiconductor fabrication system.

19. A method, comprising:
identifying a defect corresponding to an electrical connection between a first circuit element and a second circuit element, the first and second circuit elements being positioned in or on a substrate and the defect being positioned in the substrate;
removing a portion of the substrate to expose the defect;
after exposing the defect, removing the defect to electrically disconnect the first and second circuit elements; and
verifying that the first and second circuit elements are electrically disconnected.

20. A method, comprising:
identifying a suspected electrical defect positioned between a first circuit element and a second circuit element, the first and second circuit elements being positioned in or on a substrate and the suspected defect being positioned in the substrate;
removing a portion of the substrate to expose the suspected defect;
after exposing the suspected defect, exposing the suspected defect to a charged particle beam to modify at least a portion of the suspected defect; and
verifying that the suspected defect corresponds to a real defect.

21. A method, comprising:
identifying a defect causing an absence of an electrical connection between a first circuit element and a second circuit element, the first and second circuit elements being positioned in or on a substrate and the defect being positioned in the substrate;
removing a portion of the substrate to expose the defect;
depositing a conductive material to electrically connect the first and second circuit elements; and
verifying that the defect caused the absence of an electrical connection between the first and second circuit elements,
wherein:
identifying the defect comprises exposing the first and second circuit elements to a charged particle beam to cause particles to leave the substrate, and forming an image of the first and second circuit elements based on the particles that leave the substrate; and
identifying the defect further comprises identifying a difference in intensity between the first and second circuit elements in the image.

22. A method, comprising:
identifying a defect causing an absence of an electrical connection between a first circuit element and a second circuit element, the first and second circuit elements being positioned in or on a substrate and the defect being positioned in the substrate;
removing a portion of the substrate to expose the defect;
depositing a conductive material to electrically connect the first and second circuit elements; and
verifying that the defect caused the absence of an electrical connection between the first and second circuit elements,
wherein the first and second circuit elements comprise lines of conductive material, and the defect is positioned along a conductive path between the first and second circuit elements.

23. A method, comprising:
identifying a defect causing an absence of an electrical connection between a first circuit element and a second circuit element, the first and second circuit elements being positioned in or on a substrate and the defect being positioned in the substrate;
removing a portion of the substrate to expose the defect;
depositing a conductive material to electrically connect the first and second circuit elements; and
verifying that the defect caused the absence of an electrical connection between the first and second circuit elements,
wherein depositing the conductive material comprises directing a charged particle beam to be incident on the substrate, and directing gas molecules to be incident on the substrate in the same region as the charged particle beam.

24. A method, comprising:
identifying a defect causing an absence of an electrical connection between a first circuit element and a second circuit element, the first and second circuit elements being positioned in or on a substrate and the defect being positioned in the substrate;
removing a portion of the substrate to expose the defect;
depositing a conductive material to electrically connect the first and second circuit elements; and
verifying that the defect caused the absence of an electrical connection between the first and second circuit elements,
wherein depositing the conductive material comprises directing a charged particle beam to interact with a stream of gas molecules to deposit the conductive material to connect the first and second circuit elements.

* * * * *